United States Patent
Mähner

(10) Patent No.: US 10,629,485 B2
(45) Date of Patent: Apr. 21, 2020

(54) SURFACE MOUNTABLE ELECTRONIC COMPONENT

(75) Inventor: Claus Mähner, Heilbronn (DE)

(73) Assignee: Vishay Semiconductor GmbH, Heilbronn (DE)

( * ) Notice: Subject to any disclaimer, the term of this patent is extended or adjusted under 35 U.S.C. 154(b) by 0 days.

(21) Appl. No.: 14/342,999

(22) PCT Filed: Sep. 6, 2012

(86) PCT No.: PCT/EP2012/067378
§ 371 (c)(1),
(2), (4) Date: Jul. 8, 2014

(87) PCT Pub. No.: WO2013/034628
PCT Pub. Date: Mar. 14, 2013

(65) Prior Publication Data
US 2014/0346642 A1   Nov. 27, 2014

(30) Foreign Application Priority Data

Sep. 6, 2011   (DE) .......................... 10 2011 112 659

(51) Int. Cl.
*H01L 21/78*   (2006.01)
*H01L 23/544*   (2006.01)
(Continued)

(52) U.S. Cl.
CPC .......... *H01L 21/78* (2013.01); *H01L 23/3171* (2013.01); *H01L 23/544* (2013.01); *H01L 24/11* (2013.01); *H01L 24/14* (2013.01); *H01L 29/0657* (2013.01); *H01L 24/05* (2013.01); *H01L 24/16* (2013.01); *H01L 2223/54406* (2013.01); *H01L 2223/54473* (2013.01);
(Continued)

(58) Field of Classification Search
None
See application file for complete search history.

(56) References Cited

U.S. PATENT DOCUMENTS 3,535,774 A * 10/1970 Baker .................. H01L 23/291
                                                    257/623
3,735,483 A *  5/1973 Sheldon ................. C25D 13/22
                                                    148/DIG. 51
(Continued)

FOREIGN PATENT DOCUMENTS

DE         3826736 A1     2/1990
DE    10042931 A1 *       3/2002 ........... H01L 21/563
(Continued)

OTHER PUBLICATIONS

Koschmieder et al., "Soldering the QFN Stacked Die Sensors to a PC Board," Freescale Semiconductor Application Note, AN3111 (Apr. 2010).

*Primary Examiner* — David E Graybill
(74) *Attorney, Agent, or Firm* — Volpe and Koenig, P.C.

(57) ABSTRACT

A surface mountable electronic component free of connecting wires comprises a semiconductor substrate, wherein a plurality of solderable connection areas are arranged at the underside of the component. The component comprises at least one recess is formed in the region of the edges bounding the underside; and in that the recess is covered with an insulating layer. A method for the manufacture of such a component comprises the formation of corresponding recesses.

16 Claims, 4 Drawing Sheets

(51) Int. Cl.
*H01L 29/06* (2006.01)
*H01L 23/31* (2006.01)
*H01L 23/00* (2006.01)

(52) U.S. Cl.
CPC .............. *H01L 2224/02379* (2013.01); *H01L 2224/0401* (2013.01); *H01L 2224/05008* (2013.01); *H01L 2224/05569* (2013.01); *H01L 2224/05572* (2013.01); *H01L 2224/131* (2013.01); *H01L 2224/1451* (2013.01); *H01L 2224/16225* (2013.01); *H01L 2224/16227* (2013.01); *H01L 2224/81192* (2013.01); *H01L 2924/00014* (2013.01); *H01L 2924/12042* (2013.01)

(56) References Cited

U.S. PATENT DOCUMENTS

| | | | | |
|---|---|---|---|---|
| 3,852,876 | A * | 12/1974 | Sheldon | H01L 21/78 148/DIG. 28 |
| 3,972,113 | A * | 8/1976 | Nakata | H01L 21/033 148/DIG. 106 |
| 3,984,859 | A * | 10/1976 | Misawa | H01L 29/00 257/495 |
| 4,040,084 | A * | 8/1977 | Tanaka | H01L 21/00 257/496 |
| 4,080,621 | A * | 3/1978 | Funakawa | H01L 21/56 257/620 |
| 4,179,794 | A * | 12/1979 | Kosugi | H01L 21/31654 148/DIG. 28 |
| 4,255,757 | A * | 3/1981 | Hikin | H01L 29/0657 257/496 |
| 4,904,609 | A * | 2/1990 | Temple | H01L 21/78 148/DIG. 126 |
| 4,929,300 | A | 5/1990 | Wegleiter | |
| 4,974,050 | A | 11/1990 | Fuchs | |
| 4,984,130 | A * | 1/1991 | Dull | H01C 1/148 338/327 |
| 4,999,684 | A * | 3/1991 | Temple | H01L 21/78 257/517 |
| 5,164,218 | A * | 11/1992 | Tsuruta | H01L 21/187 438/405 |
| 5,477,253 | A * | 12/1995 | Hotomi | B41J 2/14 347/71 |
| 5,482,887 | A * | 1/1996 | Duinkerken | H01L 21/78 148/DIG. 12 |
| 5,593,927 | A * | 1/1997 | Farnworth | H01L 23/291 257/E23.118 |
| 5,801,432 | A | 9/1998 | Rostoker et al. | |
| 6,127,720 | A * | 10/2000 | Nakura | H01L 21/76232 257/509 |
| 6,219,908 | B1 | 4/2001 | Farnworth et al. | |
| 6,238,952 | B1 | 5/2001 | Lin | |
| 6,245,598 | B1 * | 6/2001 | Chen | H01L 23/3114 257/698 |
| 6,326,698 | B1 | 12/2001 | Akram | |
| 6,400,004 | B1 | 6/2002 | Fan et al. | |
| 6,420,245 | B1 * | 7/2002 | Manor | B23K 26/0093 438/460 |
| 6,544,821 | B2 * | 4/2003 | Akram | H01L 21/56 257/E21.503 |
| 6,608,366 | B1 | 8/2003 | Fogelson et al. | |
| 6,624,505 | B2 * | 9/2003 | Badehi | H01L 23/3114 257/627 |
| 6,680,524 | B2 * | 1/2004 | Minamio | H01L 23/3128 257/666 |
| 6,693,358 | B2 * | 2/2004 | Yamada | H01L 21/76898 257/622 |
| 6,717,245 | B1 * | 4/2004 | Kinsman | H01L 21/561 257/678 |
| 6,759,745 | B2 * | 7/2004 | Masumoto | H01L 21/6835 257/730 |
| 6,774,659 | B1 | 8/2004 | Chiang | |
| 6,777,797 | B2 * | 8/2004 | Egawa | H01L 23/3128 257/686 |
| 6,780,746 | B2 * | 8/2004 | Kinsman | H01L 21/561 257/E21.503 |
| 6,781,244 | B2 * | 8/2004 | Prabhu | H01L 23/482 257/778 |
| 6,803,298 | B2 * | 10/2004 | Hamerski | H01L 29/66136 257/927 |
| 6,812,548 | B2 * | 11/2004 | Dias | H01L 23/3677 257/620 |
| 6,856,026 | B2 * | 2/2005 | Yamada | H01L 21/76898 257/622 |
| 6,864,172 | B2 * | 3/2005 | Noma | H01L 21/6836 257/E21.508 |
| 6,888,231 | B2 | 5/2005 | Maeda | |
| 6,914,770 | B1 * | 7/2005 | Goldberger | H01G 9/012 361/524 |
| 6,987,034 | B1 | 1/2006 | Chiang | |
| 7,064,014 | B2 * | 6/2006 | Dias | H01L 23/3677 257/E23.087 |
| 7,085,127 | B2 * | 8/2006 | Goldberger | H01G 9/012 361/523 |
| 7,088,573 | B2 * | 8/2006 | Goldberger | H01G 9/012 361/523 |
| 7,101,735 | B2 * | 9/2006 | Noma | H01L 21/6835 257/E21.597 |
| 7,115,483 | B2 * | 10/2006 | Kwon | H01L 23/3121 438/460 |
| 7,119,421 | B2 | 10/2006 | Rohrmoser et al. | |
| 7,129,114 | B2 * | 10/2006 | Akram | B28D 1/221 438/110 |
| 7,157,297 | B2 * | 1/2007 | Kamikawa | H01S 5/2231 257/E21.09 |
| 7,167,357 | B2 * | 1/2007 | Goldberger | H01G 9/012 361/523 |
| 7,179,309 | B2 * | 2/2007 | Goldberger | H01G 9/012 29/25.03 |
| 7,183,136 | B2 * | 2/2007 | Hashimura | B23K 26/18 257/E21.559 |
| 7,183,630 | B1 | 2/2007 | Fogelson et al. | |
| 7,208,340 | B2 * | 4/2007 | Noma | H01L 21/4846 257/467 |
| 7,218,001 | B2 * | 5/2007 | Seng | H01L 24/32 257/730 |
| 7,221,555 | B2 * | 5/2007 | Goldberger | H01G 9/012 361/525 |
| 7,256,073 | B2 * | 8/2007 | Noma | H01L 21/76898 257/E21.597 |
| 7,264,995 | B2 * | 9/2007 | Kim | H01L 23/3114 257/E23.021 |
| 7,282,431 | B2 * | 10/2007 | Kang | H01L 24/48 257/676 |
| 7,301,222 | B1 * | 11/2007 | Patwardhan | H01L 24/32 257/620 |
| 7,312,107 | B2 * | 12/2007 | Noma | H01L 21/6835 257/E23.021 |
| 7,312,521 | B2 * | 12/2007 | Noma | H01L 23/3114 257/621 |
| 7,387,911 | B2 * | 6/2008 | Audette | H01L 21/78 257/620 |
| 7,394,152 | B2 * | 7/2008 | Yu | H01L 23/3114 257/690 |
| 7,399,683 | B2 * | 7/2008 | Noma | H01L 21/6836 257/E21.508 |
| 7,413,927 | B1 * | 8/2008 | Patwardhan | H01L 24/32 438/108 |
| 7,413,931 | B2 * | 8/2008 | Noma | H01L 23/3114 257/701 |
| 7,456,083 | B2 * | 11/2008 | Noma | H01L 21/561 257/797 |
| 7,495,341 | B2 * | 2/2009 | Zilber | H01L 24/11 257/693 |
| 7,514,291 | B2 * | 4/2009 | Akram | B28D 1/221 438/110 |
| 7,598,154 | B2 * | 10/2009 | Izumi | B28D 5/022 438/113 |

(56) References Cited

U.S. PATENT DOCUMENTS

| | | | |
|---|---|---|---|
| 7,642,631 B2* | 1/2010 | Lu | H01L 21/78 257/685 |
| 7,645,635 B2 | 1/2010 | Wood et al. | |
| 7,675,153 B2* | 3/2010 | Kurosawa | H01L 21/6836 257/686 |
| 7,691,726 B2* | 4/2010 | Seng | H01L 24/32 257/730 |
| 7,714,448 B2* | 5/2010 | Miyata | H01L 23/3114 257/778 |
| 7,719,102 B2* | 5/2010 | Noma | H01L 21/6836 257/684 |
| 7,738,755 B2* | 6/2010 | Shioda | G02B 6/1221 385/129 |
| 7,781,888 B2* | 8/2010 | Kobayakawa | H01L 21/4828 257/690 |
| 7,816,186 B2 | 10/2010 | San Antonio et al. | |
| 7,823,322 B2* | 11/2010 | Palmade | H01L 23/13 257/622 |
| 7,824,941 B2 | 11/2010 | Braune et al. | |
| 7,833,881 B2* | 11/2010 | Farnworth | H01L 21/561 257/734 |
| 7,838,424 B2* | 11/2010 | Karta | H01L 21/561 257/730 |
| 7,892,890 B2* | 2/2011 | Kurosawa | H01L 21/6836 257/686 |
| 7,919,875 B2* | 4/2011 | Noma | H01L 21/6835 257/620 |
| 7,952,176 B2* | 5/2011 | Pagaila | H01L 21/76898 257/676 |
| 7,981,727 B2* | 7/2011 | Liu | H01L 23/3114 257/E21.523 |
| 8,017,447 B1 | 9/2011 | Olsen | |
| 8,105,856 B2* | 1/2012 | Noma | H01L 23/3114 438/113 |
| 8,154,135 B2* | 4/2012 | Kim | H01L 24/92 257/686 |
| 8,198,104 B2* | 6/2012 | Urano | H01L 21/288 257/E21.006 |
| 8,227,901 B2* | 7/2012 | Seki | H01L 29/0649 257/622 |
| 8,329,509 B2 | 12/2012 | Gong et al. | |
| 8,368,181 B2* | 2/2013 | Suzuki | H01L 29/8613 257/586 |
| 8,406,004 B2* | 3/2013 | Pagaila | H01L 23/3128 257/608 |
| 8,426,949 B2* | 4/2013 | Seki | H01L 29/0603 257/622 |
| 8,507,327 B2* | 8/2013 | Tsukamoto | H01L 21/26586 257/E21.347 |
| 8,536,694 B2* | 9/2013 | Inomata | H01L 23/3114 257/687 |
| 8,582,314 B2* | 11/2013 | Park | H01L 23/13 174/256 |
| 8,685,795 B2 | 4/2014 | Wang | |
| 8,809,121 B2 | 8/2014 | Li et al. | |
| 9,018,096 B2* | 4/2015 | Price | H01L 21/7688 257/E21.586 |
| 9,018,537 B2* | 4/2015 | Karrer | H01G 2/065 174/260 |
| 9,418,919 B2 | 8/2016 | Groenhuis et al. | |
| 2001/0051392 A1* | 12/2001 | Akram | H01L 21/56 438/106 |
| 2002/0027257 A1 | 3/2002 | Kinsman et al. | |
| 2002/0047210 A1* | 4/2002 | Yamada | H01L 21/76898 257/774 |
| 2002/0050631 A1* | 5/2002 | Minamio | H01L 23/3128 257/678 |
| 2002/0063315 A1 | 5/2002 | Huang et al. | |
| 2003/0006055 A1 | 1/2003 | Chien-Hung et al. | |
| 2003/0062613 A1* | 4/2003 | Masumoto | H01L 21/6835 257/687 |
| 2003/0080398 A1* | 5/2003 | Badehi | H01L 23/3114 257/678 |
| 2003/0102526 A1* | 6/2003 | Dias | H01L 23/3677 257/618 |
| 2003/0111720 A1* | 6/2003 | Tan | H01L 25/0657 257/686 |
| 2003/0205781 A1* | 11/2003 | Hamerski | H01L 29/66136 257/618 |
| 2003/0209772 A1* | 11/2003 | Prabhu | H01L 23/482 257/434 |
| 2003/0230805 A1* | 12/2003 | Noma | H01L 23/3114 257/737 |
| 2004/0000723 A1* | 1/2004 | Egawa | H01L 23/3128 257/777 |
| 2004/0017012 A1* | 1/2004 | Yamada | H01L 21/76898 257/774 |
| 2004/0046240 A1 | 3/2004 | Hasebe et al. | |
| 2004/0063268 A1* | 4/2004 | Noma | H01L 21/6836 438/202 |
| 2004/0137723 A1* | 7/2004 | Noma | H01L 21/6835 438/667 |
| 2004/0161920 A1* | 8/2004 | Noma | H01L 21/4846 438/620 |
| 2004/0235270 A1* | 11/2004 | Noma | H01L 23/3114 438/460 |
| 2004/0238926 A1 | 12/2004 | Obinata | |
| 2005/0009313 A1* | 1/2005 | Suzuki | H01L 23/3114 438/611 |
| 2005/0012205 A1* | 1/2005 | Dias | H01L 23/3677 257/712 |
| 2005/0048740 A1* | 3/2005 | Noma | H01L 21/6835 438/460 |
| 2005/0051882 A1* | 3/2005 | Kwon | H01L 23/3121 257/678 |
| 2005/0093174 A1* | 5/2005 | Seng | H01L 24/32 257/782 |
| 2005/0095750 A1* | 5/2005 | Lo | H01L 21/56 438/114 |
| 2005/0116321 A1 | 6/2005 | Li et al. | |
| 2005/0176235 A1* | 8/2005 | Noma | H01L 21/6836 438/614 |
| 2005/0186760 A1* | 8/2005 | Hashimura | B23K 26/18 438/460 |
| 2005/0195553 A1* | 9/2005 | Goldberger | H01G 9/012 361/300 |
| 2005/0195558 A1* | 9/2005 | Goldberger | H01G 9/012 361/523 |
| 2005/0202651 A1* | 9/2005 | Akram | B28D 1/221 438/463 |
| 2005/0208735 A1* | 9/2005 | Noma | H01L 21/561 438/460 |
| 2005/0250234 A1* | 11/2005 | Kamikawa | H01S 5/2231 438/47 |
| 2006/0056134 A1* | 3/2006 | Goldberger | H01G 9/012 361/508 |
| 2006/0061939 A1* | 3/2006 | Goldberger | H01G 9/012 361/510 |
| 2006/0068572 A1* | 3/2006 | Noma | H01L 23/3114 438/577 |
| 2006/0079019 A1* | 4/2006 | Kim | H01L 23/3114 438/106 |
| 2006/0079024 A1* | 4/2006 | Akram | B28D 1/221 438/110 |
| 2006/0104007 A1* | 5/2006 | Goldberger | H01G 9/012 361/309 |
| 2006/0105547 A1* | 5/2006 | Audette | H01L 21/78 438/464 |
| 2006/0141750 A1* | 6/2006 | Suzuki | H01L 21/76898 438/460 |
| 2006/0175697 A1* | 8/2006 | Kurosawa | H01L 21/6836 257/686 |
| 2006/0270093 A1* | 11/2006 | Noma | H01L 21/76898 438/64 |
| 2007/0102802 A1* | 5/2007 | Kang | H01L 24/48 257/686 |
| 2007/0126092 A1 | 6/2007 | San Antonio et al. | |

(56) References Cited

U.S. PATENT DOCUMENTS

| | | | | |
|---|---|---|---|---|
| 2007/0138498 A1* | 6/2007 | Zilber | H01L 27/14618 | 257/99 |
| 2007/0173035 A1* | 7/2007 | Izumi | B28D 5/022 | 438/464 |
| 2007/0247821 A1* | 10/2007 | Kobayakawa | H01L 21/4828 | 361/743 |
| 2007/0257365 A1* | 11/2007 | Lu | H01L 21/78 | 257/737 |
| 2008/0006910 A1* | 1/2008 | Miyata | H01L 23/3114 | 257/622 |
| 2008/0067634 A1* | 3/2008 | Swee Seng | H01L 24/32 | 257/620 |
| 2008/0093708 A1* | 4/2008 | Noma | H01L 21/6835 | 257/620 |
| 2008/0111228 A1* | 5/2008 | Yu | H01L 23/3114 | 257/690 |
| 2008/0213976 A1* | 9/2008 | Farnworth | H01L 21/561 | 438/460 |
| 2008/0224320 A1* | 9/2008 | Palmade | H01L 23/13 | 257/773 |
| 2008/0265424 A1* | 10/2008 | Noma | H01L 21/6836 | 257/762 |
| 2009/0011543 A1* | 1/2009 | Karta | H01L 21/561 | 438/114 |
| 2009/0050996 A1* | 2/2009 | Liu | H01L 23/3114 | 257/434 |
| 2009/0142026 A1* | 6/2009 | Shioda | G02B 6/1221 | 385/131 |
| 2009/0160035 A1* | 6/2009 | Suzuki | H01L 29/6609 | 257/623 |
| 2009/0189257 A1* | 7/2009 | Seki | H01L 29/0603 | 257/626 |
| 2009/0197361 A1* | 8/2009 | Braune | H01L 33/505 | 438/27 |
| 2009/0266593 A1 | 10/2009 | Karrer | | |
| 2009/0309194 A1* | 12/2009 | Seki | H01L 29/0649 | 257/623 |
| 2010/0044839 A1* | 2/2010 | Okada | H01L 29/0661 | 257/622 |
| 2010/0112755 A1* | 5/2010 | Kurosawa | H01L 21/6836 | 438/109 |
| 2010/0140813 A1* | 6/2010 | Pagaila | H01L 21/76898 | 257/782 |
| 2010/0142174 A1* | 6/2010 | Pagaila | H01L 23/3128 | 361/820 |
| 2010/0240213 A1* | 9/2010 | Urano | H01L 21/288 | 438/652 |
| 2010/0258936 A1* | 10/2010 | Kim | H01L 24/92 | 257/692 |
| 2011/0031615 A1* | 2/2011 | Inomata | H01L 23/3114 | 257/737 |
| 2011/0108883 A1* | 5/2011 | Tsukamoto | H01L 21/26586 | 257/144 |
| 2011/0176285 A1* | 7/2011 | Park | H01L 23/13 | 361/783 |
| 2012/0153502 A1* | 6/2012 | Price | H01L 21/7688 | 257/774 |
| 2014/0051194 A1* | 2/2014 | Herrmann | H01L 33/0079 | 438/27 |
| 2014/0167238 A1 | 6/2014 | Jeon et al. | | |
| 2014/0346642 A1* | 11/2014 | Mahner | H01L 23/3171 | 257/620 |

FOREIGN PATENT DOCUMENTS

| | | | | |
|---|---|---|---|---|
| EP | 2230688 A1 | | 9/2010 | |
| JP | 53078169 A | * | 7/1978 | |
| JP | 55133542 A | * | 10/1980 | H01L 21/31 |
| JP | 5957476 A | | 4/1984 | |
| JP | 59057476 A | * | 4/1984 | |
| JP | 60066830 A | * | 4/1985 | |
| JP | 2000164851 A | | 6/2000 | |
| JP | WO 03003445 A1 | * | 1/2003 | H01L 21/563 |
| JP | 2004288816 A | * | 10/2004 | H01L 21/78 |
| WO | WO-03077306 A1 | * | 9/2003 | H01L 29/8613 |
| WO | 2004040661 A2 | | 5/2004 | |
| WO | WO-2006054606 A1 | * | 5/2006 | H01L 23/3114 |
| WO | 2006075197 A1 | | 7/2006 | |
| WO | WO 2006075197 A1 | * | 7/2006 | H01L 21/563 |
| WO | 2009156970 A1 | | 12/2009 | |

\* cited by examiner

SURFACE MOUNTABLE ELECTRONIC COMPONENT

FIELD OF INVENTION

The present invention relates to a surface mountable electronic component free of connection wires having a semiconductor substrate, wherein a plurality of solderable connection areas are arranged at the underside of the component, as well as to a method for its manufacture.

BACKGROUND

Such a surface mountable component, as is described, for example, in DE 20 2008 005 708 U1, is typically electrically conductively connected to a circuit board ("printed circuit board", PCB). For this purpose such a component, however, has no connection wires which project out of the housing of the component or which protrude from the housing in order to be connected to the circuit board in accordance with the principle of through plug assembly. In contrast to this, a surface mountable component has a plurality of solderable connection areas by means of which the component is soldered to the circuit board. For this purpose a corresponding arrangement of contacting surfaces is provided at the circuit board. The contacting surfaces are, for example, printed with a soldering paste by means of screen printing or stencil printing. Following the equipping of the circuit board with a plurality of components these are soldered to the contacting surfaces of the circuit board by a so-called reflow process. Alternatively to this it is also known to initially bond the surface mountable components at the circuit board and to finally solder these in a so-called wave bath or a splash bath.

The arrangement of the connection areas at the underside of the components is precisely defined so that a corresponding arrangement of contacting surfaces can be provided at the associated circuit board.

A particular advantage of components designed in this manner consists therein that these only require very little space on the circuit board. Thus a large packing density results.

However, on soldering such surface mountable components, the danger arises that excess solder comes into contact with the side surfaces of the components, which side surfaces are generally formed by the semiconductor substrate, and thereby cause short circuits. The side surfaces of such a surface mountable component are namely typically non-electrically insulated due to the manufacturing process. The danger of short circuits can thereby be prevented that the connection areas are shifted from the edge of the component towards the inside. This is, however, frequently not possible or is not desired due to reasons of space. Furthermore, the spacing of the connection areas to the underside of the component and thus finally also to the side surfaces can be increased in that additional layers in the form of thick metallized layers and/or platforms of insulation layers are provided between the underside of the component and the connection areas. Both variants can, however, technically only be implemented in a limited manner and require additional process steps on the manufacture of the component which are associated with a high demand in effort and cost.

For this reason it is the object of the invention to provide an electronic component of the initially named kind which can be mounted safely and reliably at the circuit board and which can be manufactured cost-effectively.

SUMMARY

The subject matter satisfying this object is provided by a component having the features of claim 1 and in particular thereby that at least one recess is formed in the region of the edges bounding the underside, and in that the recess is covered with an insulating layer. Through the introduction of one or more recesses and the covering of this (these) recess(es) with an insulation layer the effective spacing between the connection areas and the non-insulated side surfaces of the semiconductor substrate is increased. It is thereby prevented in a simple and at the same time effective manner that excess solder, for example, due to the pressing force and/or due to capillary forces comes into contact with the substantially non-insulated side surfaces of the semiconductor substrate during the soldering of the component to a circuit board. The recesses can be provided extending peripherally, this means extending over all of the edges surrounding the underside or can also only be provided in part sections, for example, at such part sections which are located in the direct vicinity of connection areas.

If reference is made to the underside or to any other side of the component in connection with the invention then this reference relates to the position of use of the component, this means when the component is, for example, mounted at a circuit board after its manufacture.

The component preferably has connection areas exclusively at its underside and thereby distinguishes itself from components which have further connection areas, for example, also at the upper side of the component, such as is the case, for example, for transistors manufactured in accordance with the so-called mesa process or for other components.

In accordance with a further preferred embodiment the semiconductor substrate is manufactured by means of a planar process. The semiconductor substrate is preferably undoped in the region of its side surfaces. In particular, no p/n transitions are present in the region of the side surfaces. Thereby it is not required and in particular also not provided to cover the side surfaces with a passivating material which would necessarily be required for the previously mentioned mesa structures. Lateral plane surfaces are covered with the insulation layer merely in the region of the recesses, this means surfaces inclined with regard to the underside of the component. Thereby, the manufacture of the component is simplified, which will still be explained in detail in the following.

In accordance with an advantageous embodiment, the maximum depth of the recess amounts to at least 5 µm and to at most 40 µm, preferably to approximately 10 to 15 µm. The largest possible depth of the recesses is understood to be the maximum depth, this means the distance of the deepest point of the recess from the plane defined by the underside of the component. For maximum depths smaller than 5 µm no improvement of the short circuit safety can be achieved on soldering, while for maximum depths of more than 40 µm only a small increase of the short circuit safety is to be expected in comparison to the additional manufacturing demand in effort and cost.

In relative terms the maximum depth of the recess preferably amounts to at least 2% and to at most 10% of the height of the component, in particular to between approximately 3% to 6% of the height of the component. This means, that the respective recess (and preferably also the associated insulation layer) merely extends along a small fraction of the height of the component.

In order to reliably avoid a short circuit between the connection areas and the side surfaces of the component due to solder, the respective recess does not have to be particularly deep, but it can rather be designed flat. In accordance with an advantageous embodiment, the mentioned maximum depth can approximately correspond to the width of the recess or even be less than this. The width of the recess is understood to be the maximum lateral extent of the recess and indeed starting from a plane which is defined by the associated side surfaces of the component. In particular, the maximum depth of the recess can amount to at most half of the width of the trench which is formed prior to the separation of adjacent components in order to generate the respective recess.

In accordance with an advantageous embodiment of the invention the recess is designed as a hollow groove, this means as a round recess which, in cross-section, preferably corresponds to a quarter of a circle. Such a hollow groove is also referred to as a U trench. Due to the separation of adjacent components after the formation of such U trenches the respective recess naturally only has a half U shape.

Alternatively the recess can have a planar shoulder section which is inclined with respect to a plane defined by the underside of the component, wherein the degree of inclination preferably amounts to 30 to 80°, in particular amounts to approximately 60°. Such a design of the recess is also referred to as a V trench. Furthermore, a combination of U shaped and V shaped recesses or trenches is also possible. From this a substantially trapezoidal shape of the concerned trench results, this means that a plateau is additionally provided at the underside of the V shape in comparison to a V shape. The recess in this case (after the separation of adjacent components) has the corresponding shape of half a trapezium.

Preferably, the recess further comprises a base section which bounds the inclined shoulder section on the one side and a side surface of the substrate on the other side which base section preferably runs in parallel to the plane defined by the underside of the semiconductor substrate.

Preferably, the insulation layer comprises silicon oxide, silicon nitride, paint and/or adhesive. Such materials have been proven to be particularly suitable for the manufacture of the insulation layer. In particular, these materials are common to the manufacture of electronic components so that no additional technologies or so far non-typical technologies must be used.

In accordance with a further preferred embodiment of the invention the thickness of the insulation layer is less than 2 µm, preferably less than 1 µm. It is thus sufficient to apply a comparatively thin insulation layer at the recesses, wherein a uniform layer thickness is not necessarily required. However, a minimum thickness should not fall below 50 nm in order to ensure a sufficient stability and capability of insulation of the insulation layer.

A further object of the information consists therein to provide a method for the manufacture of an electronic component which is free of connection wires of the initially named kind and which avoids the initially mentioned disadvantages and can be carried out cost-effectively.

The subject matter satisfying this object is provided by the features of the independent method claims and in particular by a method for the manufacture of surface mountable electronic components which are free of connection wires which each have a respective semiconductor substrate at whose underside a plurality of solderable connection areas are arranged. The method comprising the steps of:

formation of recesses at a surface of a wafer composed of a semiconductor substrate material, wherein the recesses extend along a separation line which separate a component from an adjacent component;

application of an insulation layer which covers at least the recesses; and separation of the components along the separation lines.

The introduction of the recesses and the application of the insulation layer preferably takes place prior to the separation of the components. Thereby, the recesses and the insulation layer can be generated in a particularly simple manner. The separation can take place through suitable methods, such as, for example, by sawing or cutting, in particular by laser cutting.

In accordance with an advantageous embodiment the method further comprises the application of connection areas, wherein the connection areas can be applied both before and also after the application of the insulation layer in time. Furthermore, the insulation layer can also cover further surface sections at the underside of the component beside the recesses, for example, regions between the connection areas or such regions which are covered in a subsequent method step with metallizing layers which in turn are in contact with the connection areas.

The recesses are preferably generated by means of an etching method. The recesses can in principle also be manufactured by other methods, for example, with the aid of a laser.

In accordance with a further advantageous embodiment, the formation of the recesses and a formation of further structures in the semiconductor substrate material, in particular a formation of marking codes at a surface of the wafer lying opposite to the mentioned surface takes place in the same method step. Since marking codes in the form of recesses are anyway introduced at the upper side of the component, typically on the manufacture of components of the same type, which is also referred to as marking, and is, for example, carried out by means of an etching method, no additional method step is required for the formation of the recesses.

Preferably, the insulation layer is applied by means of chemical vapor deposition or physical vapor deposition. Thereby a sufficient hardness and homogeneity of the insulation layer is ensured. Furthermore, no modifications of the production plant are generally required for carrying out the method in accordance with the invention. Principally, also other coating methods are possible, for example, vaporization, sputtering, spraying and/or emersion in dependence on the material used for the insulation layer. The insulation layer can have a one-layer structure or a multi-layer structure.

Preferably, active structures are formed in the respective component (e.g. p/n junctions) prior to the separation of the components, wherein the separation of the components takes place along the separation lines outside of the active structures. Thus, no active structures are present in the region of the (typically non-insulated) side surfaces of the component.

The invention further relates to a method for the connection of a surface mountable electronic component which is free of connection wires in accordance with one of the apparatus claims to a circuit board which has a plurality of contacting surfaces which are associated with respective connection areas of the component. The method comprises the steps:

applying a solder at the connection areas and/or at the contacting surfaces;

positioning the component at the circuit board; and melting the solder so that each connection area is connected to the associated contacting surface by means of the solder.

Further advantageous embodiments of the invention are disclosed in the dependent claims, the description and the drawing.

BRIEF DESCRIPTION OF THE DRAWINGS

The invention is described in the following by means of embodiments with reference to the drawing. There is shown.

DETAILED DESCRIPTION OF THE PREFERRED EMBODIMENTS

Figure 1:
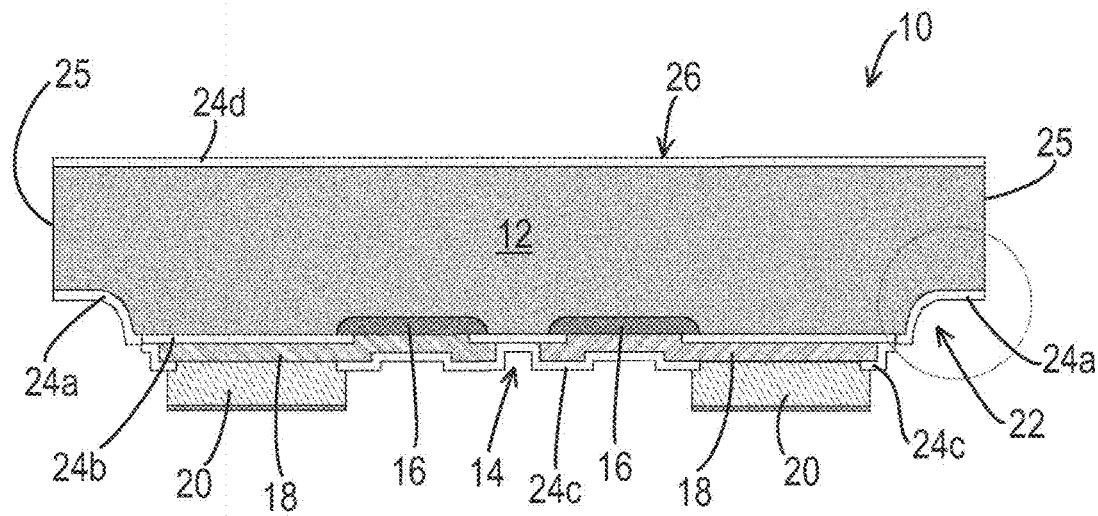
FIG. 1 a schematic cross-sectional view of an electronic component in accordance with the invention in accordance with a first embodiment.

FIGS. 1 to 5 show a surface mountable electronic component 10 which is free of connection wires in accordance with the invention in accordance with a first or a second embodiment. The component 10 is a diode in the present embodiments, such as, for example, a so-called ESD component as is used in the form of a protective diode for protection of electrostatic discharges.

The present invention is, however, not limited to diodes but can principally be used in all plausible kinds of electronic components, in particular, also in substantially more complex integrated circuits.

The component 10 comprises a semiconductor substrate 12 having a substantially quadratic shape. In the interior of the semiconductor substrate 12 two active structures 16 are present in the embodiments shown here which are formed by means of known methods in boundary regions of the semiconductor substrate 12 at the underside 14 of the component 10.

The active structures 16 are in electric contact with respective connection sections 18 which are formed at the underside 14 by corresponding metallization layers. The connection sections 18 in turn are in contact with respective solderable connection areas 20 which likewise are formed by metallization layers. As can clearly be recognized in FIG. 5, the connection areas 20 have a rectangular shape. The completed component 10 has no housing.

Figure 3:
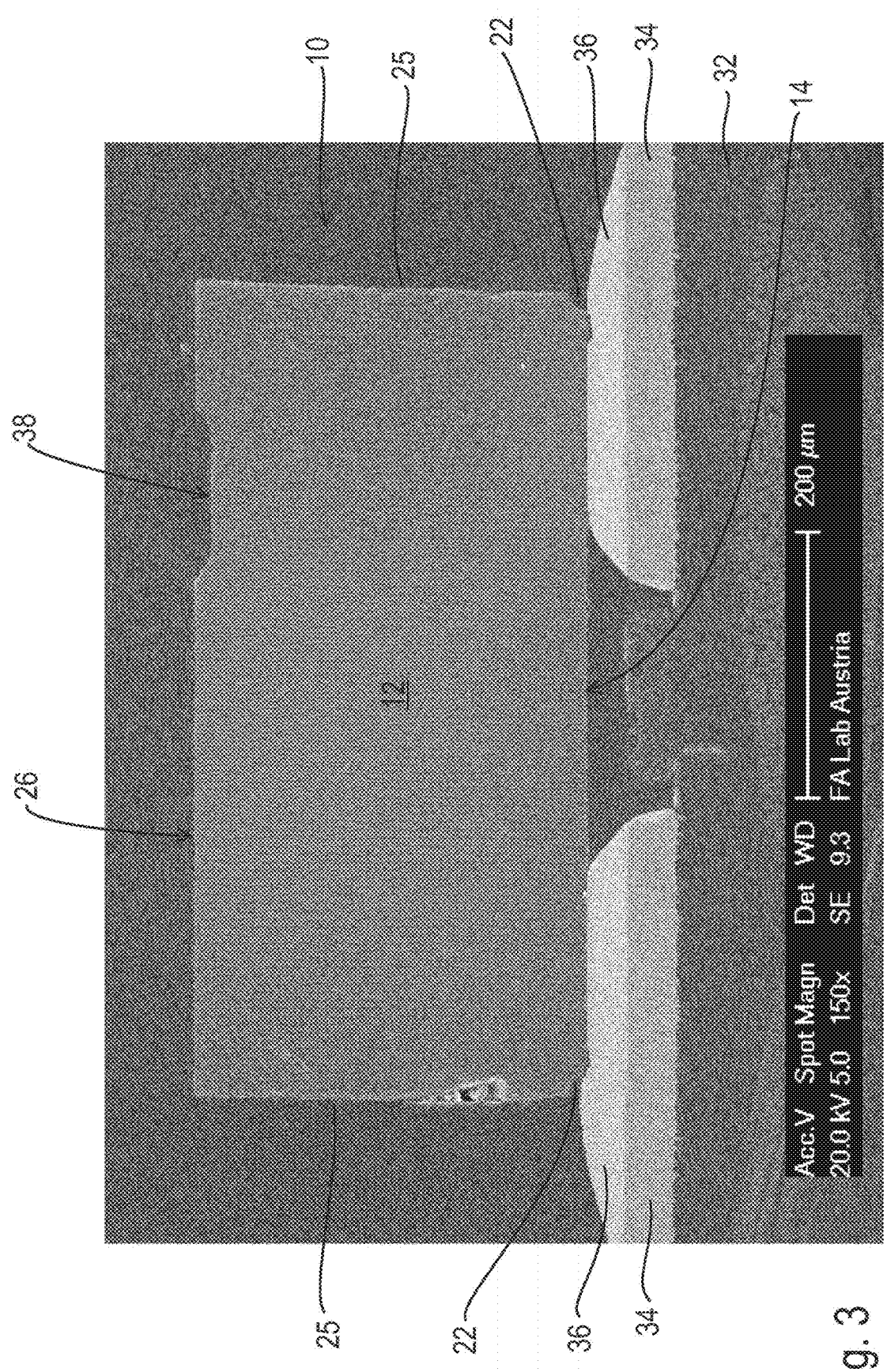
FIG. 3 a cross-sectional view of a component attached to a circuit board in accordance with the first embodiment.
Figure 4:
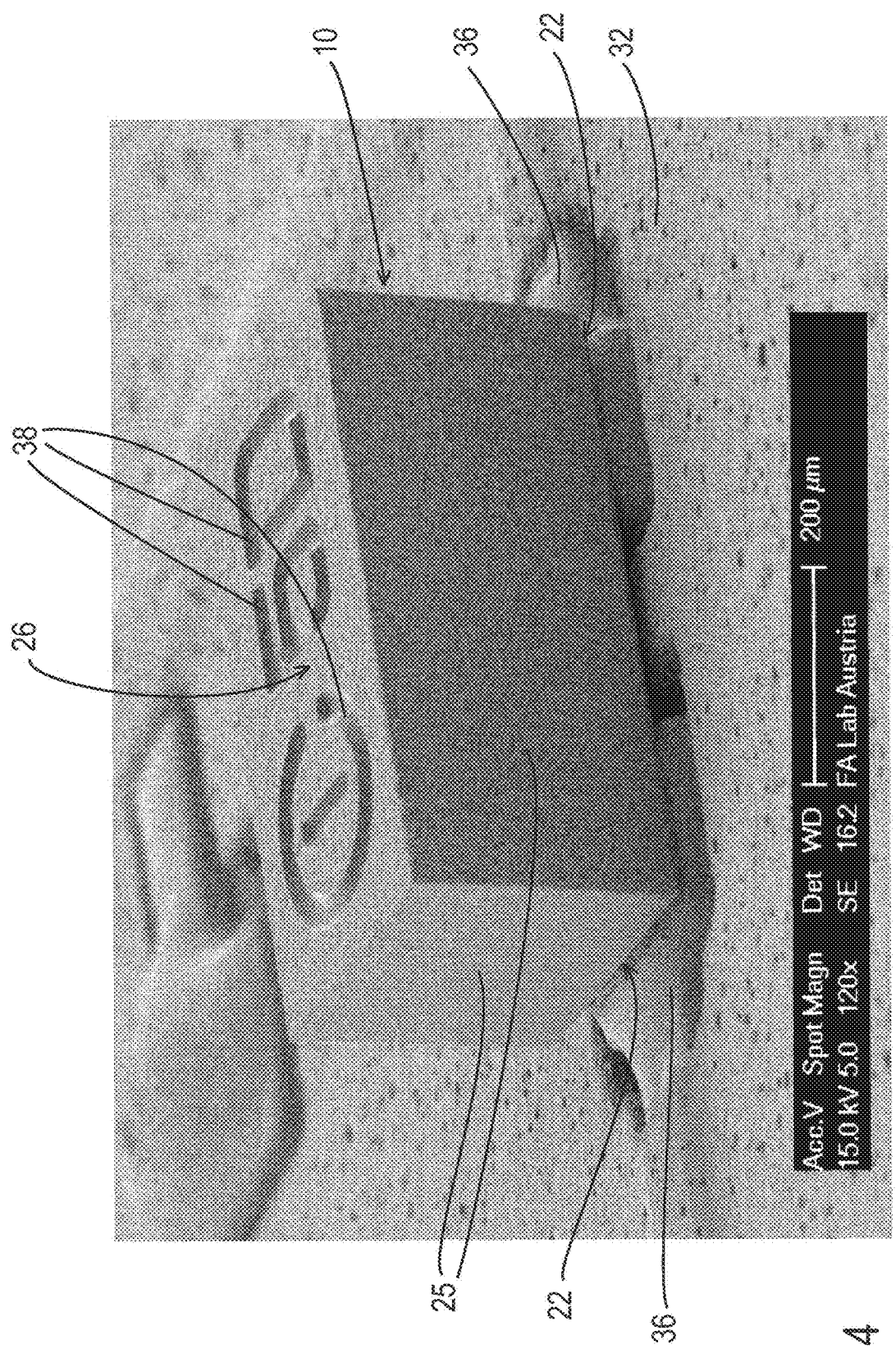
FIGS. 4 and 5 perspective views of a component in accordance with the first embodiment.

The connection areas 20 are provided for the formation of solder contacts with corresponding contacting surfaces 34 which are formed at a circuit board 32 in the form of copper surfaces (see FIG. 3 and FIG. 4). The electric and mechanical connection between the component 10 and the circuit board 32 is generated by a solder 36.

Cutouts in the shape of recesses 22 are formed at the edges surrounding the underside 14 of the component 10, this means at the surface defining the edges between the underside 14 of the semiconductor substrate 12 and at the four side surfaces 25 of the semiconductor substrate 12.

For the first embodiment in accordance with FIG. 1 and FIGS. 3 to 5 these recesses 22 have the shape of a hollow groove. The recesses 22 have a shoulder section 28 inclined by an angle of approximately 60° with regard to a plane defined by the underside 14 of the component 10. Furthermore, the recesses 22 in this example have a base section 30 bounding the inclined shoulder section 28 at one side and the corresponding side surface 25 of the component 10 at the other side, which base section runs in parallel to the plane defined by the underside 14.

In the present embodiments the recesses 22 are surrounding peripherally can, however, alternatively can also only be provided in sections surrounding the edges along the underside 14 of the component 10.

The recesses 22 are covered by an insulation layer 24a which is preferably composed of silicon oxide, however, can also be manufactured from a different electrically non-conducting material, such as, for example, silicon nitride, paint or adhesive. Also a combination of different insulating materials is possible.

A further insulation layer 24b is provided at the underside 14 of the component and directly covers the semiconductor substrate 12 with the exception of the connection points between the active structures 16 and the connection sections 18. Furthermore, an insulation layer 24c is provided which covers the connection sections 18 with the exception of the contact points between the connection sections 18 and the connection areas 20.

Finally, an insulation layer 24d is also provided at the upper side 26 of the component 10. The side surfaces 25 are free of insulation layers, with the exception of the recesses 22.

Figure 2:
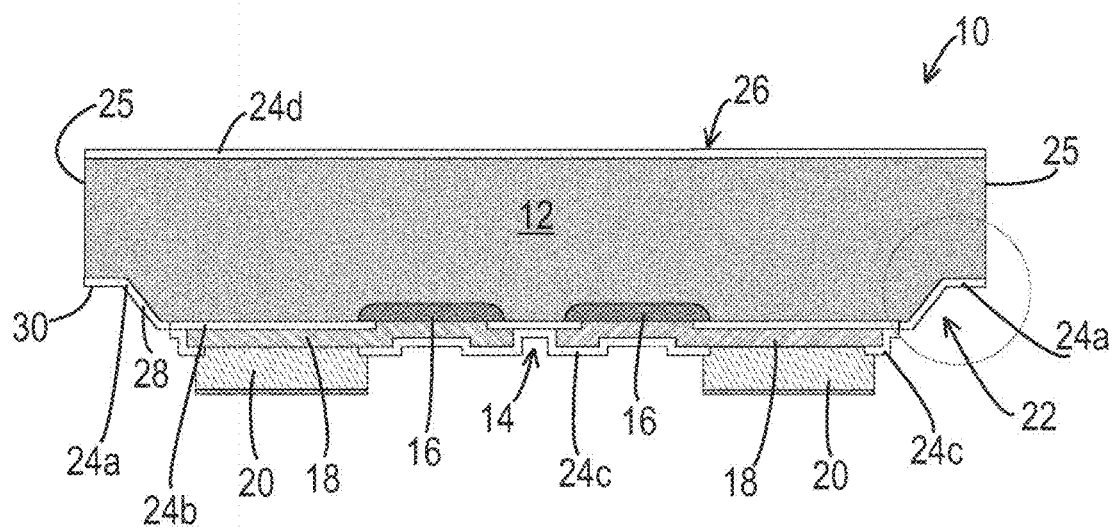
FIG. 2 a schematic cross-sectional view of an electronic component in accordance with the invention in accordance with a second embodiment.

With regard to the dimensions it should be noted that the schematic illustrations of FIG. 1 and FIG. 2 are not true to scale. Thus, in particular the recesses 22 are illustrated strongly enlarged with regard to the height and the width of the component 10. Also the different layer thicknesses are not true to scale.

Figure 5:
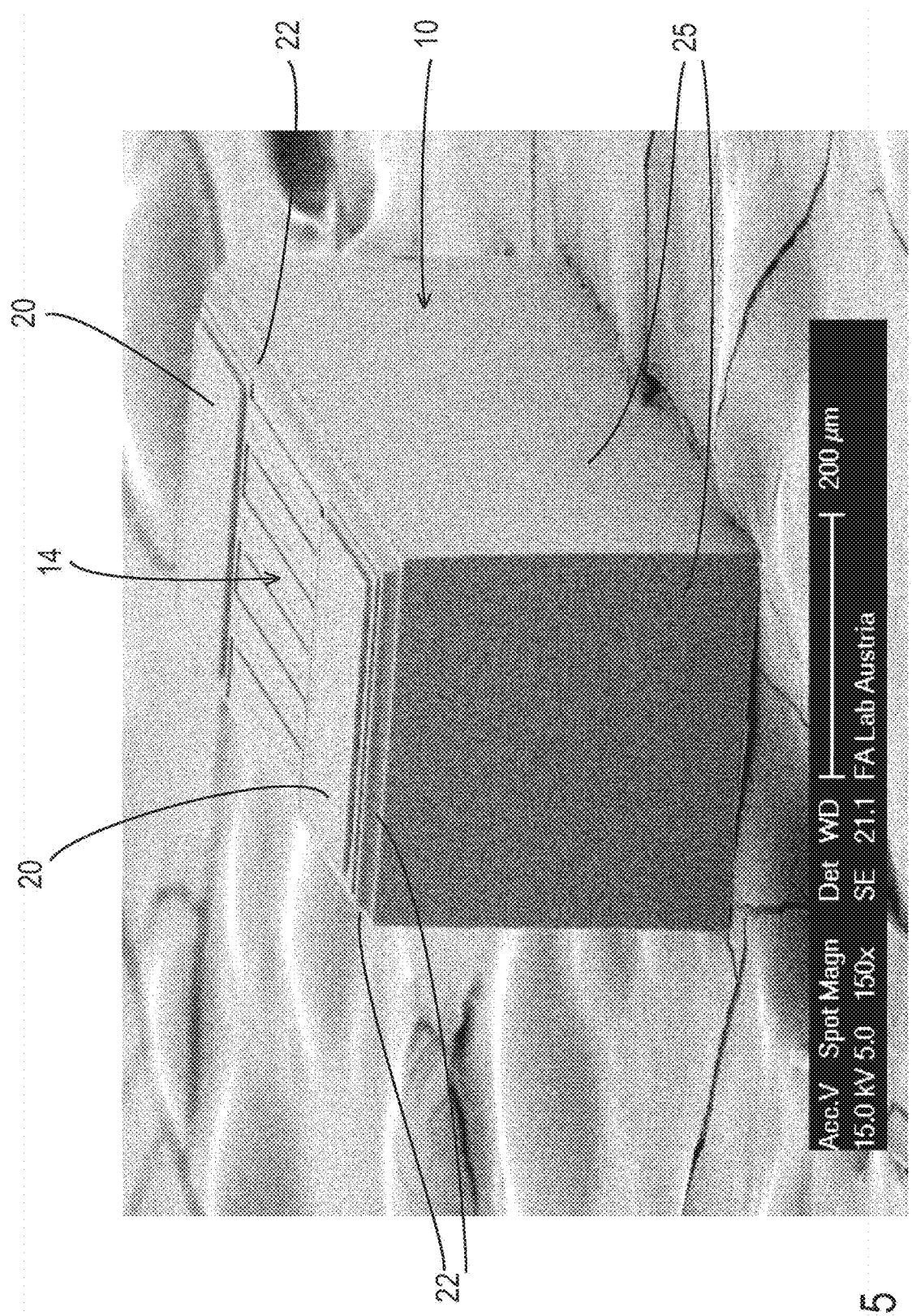

In contrast to this the component 10 is illustrated substantially to scale in FIGS. 3 to 5 which Figs. are generated by means of a scanning electron microscope. The dimensions of the component 10 (length×width×height) amount to approximately 0.6 mm×0.3 mm×0.3 mm. The maximum depth of the recesses 22 amounts to approximately 10 to 15 µm. The maximum lateral extent of the recesses 22 likewise amounts to approximately 10 to 15 µm in the embodiments in accordance with FIGS. 3 to 5, however, can principally deviate from the maximum depth.

The component 10 in accordance with the invention generally has dimensions (length, width, height) which are preferably less than 1 mm. Hereby, a particularly high stacking density can indeed be achieved at a circuit board. However, for such small dimensions of the component 10 a particularly high danger of a possible short circuit between the connection areas 20 and the non-electrically insulated side surfaces 25 exists due to the solder 36. For this reason, the recesses 22 with the insulation layer 24a are particularly advantageous for such small dimensions.

A marking code 38 is further provided at the upper side 26 of the component (FIGS. 3 and 4) which marking code 38 is formed by recesses.

The insulation layers 24a to 24d are, however, not visible in FIGS. 3 to 5 due to their thickness which preferably amounts to less than 1 µm. Furthermore, the connection sections 18 and the connection areas 20 are likewise not visible in FIG. 3 due to the position of the sectional plane.

As can clearly be recognized in FIGS. 3 and 4, in particular in the left half of the image of FIG. 3, the recesses 22 prevent the non-insulated side surfaces 25 of the component 10 or of the semiconductor substrate 12 from coming into contact with the solder 36 on attachment to the circuit board 32 in an effective manner.

Although the solder 36 has a bulge in the region of the recess 22 in the direction of the component 10, as can clearly be recognized in the left half of the image of FIG. 3, the recess 22 provides a spacing between the solder 36 and the non-insulated side surface 25 which is sufficient to avoid an electric contact or a short circuit. In the region of the recess 22 itself the electric contact is prevented by the insulation layer 24a.

With regard to the shown embodiments it should be noted that no active structures 16 (e.g. p/n transition) are present in the region of the side surfaces 25 of the component 10. The recess 22 and the associated insulation layer 24a thus merely serve the purpose of avoiding a short circuit between the connection areas 20 and the respective conductive side surfaces 25 and not e.g. between the connection areas 20 and the active structures 16 of the component 10. Hereby, relatively small requirements can be expected of the respective recesses 22 and in particular of the associated insulation layer 24a (material and thickness) in order to effect the desired short circuit safety (in comparison, for example, to the electric insulation of a p/n junction).

In the following, a method will be described merely by way of example by means of which components 10 in accordance with the invention can be manufactured.

Typically, the manufacture of components 10 of this kind thereby takes place in that the desired semiconductor structures (active structures 16) are initially generated for a plurality of components 10 in a wafer in a planar process in a rasterized manner and then the respective connection areas 20 as well as the associated connection sections 18 are applied. The wafer is then separated by means of suitable separation methods, such as, for example, sawing, laser cutting or other cutting processes in order to separate the completed components 10. A further processing of the separated components 10 is generally not required and would, in particular for very small components, if at all, only be possible with a very large demand in effort and cost.

The method of manufacture in accordance with the invention additionally provides that the recesses 22 are introduced into the wafer already prior to the separation. This can, for example, take place by etching, wherein the recesses 22 are preferably generated in the same method step as the marking code 38. The recesses 22 are introduced along the latter separation points between the components to be separated in the form of, for example, U shaped trenches (FIG. 1) or V shaped trenches (FIG. 2). The latter separation of the individual components 10 takes place in the region of these trenches, with a symmetric separation of the trench contour being striven for in order to ensure uniform dimensions of the recess 22. Thus, approximately one half of a trench is provided for each component 10, when considered in cross-section, while the other half is provided for a respective adjacent component 10.

Through suitable measures, such as, for example, a sufficient dimensioning of the section of the recess 22 parallel to the underside 14 (FIG. 1) or of the base section 30 (FIG. 2) it can be ensured that no separation takes place in the direct region of the actual hollow groove (FIG. 1) or of the shoulder section 28 (FIG. 2) on the separation of the components 10 also for certain tolerances and thus a sufficient maximum depth of the recesses 22 is ensured.

The application of the insulation layer 24a likewise takes place prior to the separation. For example, the insulation layers 24a can be applied at the same time with one or more of the remaining insulation layers 24b to 24d at the recesses 22 so that masking steps demanding in effort and cost can be omitted.

Through the method in accordance with the invention a surface mountable electronic component which is free of connection wires can be manufactured in a simple and cost-effective manner which can be connected to a circuit board 32 in a reliable manner on the avoidance of short circuits by means of soldering.

For this purpose, the separated components 10 are positioned at a respective circuit board 32, for example, by means of a placement machine and is soldered to the contacting surfaces 34 there. Should the solder 36 have been provided at the contacting surfaces 34 of the circuit board 32 previously for this purpose, the provision of the recesses 22 with the respective insulation layer 24a at the component 10 is found to be particularly advantageous, since the contacting surfaces 34 of the circuit board 32 (and thus the thereon provided solder 36) typically projects from the periphery of the respective component 10, whereby a particularly high danger of a short circuit arises.

The invention claimed is:

1. A surface mountable electronic component free of connecting wires, having an upper side and an underside, the surface mountable electronic component comprising:
 a semiconductor substrate having an upper side surface, an underside surface and four side surfaces, wherein each of the four side surfaces join the underside surface at an edge and are not insulated;
 a plurality of planar solderable surfaces formed on the underside of the component;
 at least one recess formed in at least a region of the edge, the at least one recess covered with a first insulating layer,
 wherein for each at least one recess, a combination of the recess and the first insulating layer forms a hollow groove;
 at least one active region formed in a region of the semiconductor structure that is spaced apart from the side surfaces of the semiconductor substrate such that the at least one active region does not contact the hollow groove and the first insulating layer does not completely cover an exposed portion of the at least one active region;
 a metallized connection section running directly between the exposed portion of the at least one active area and a downwardly extending metallized connection area;
 the connection section at least partially covered by a second insulating layer which covers the connection section with the exception of a contact point between the connection section and the connection area;
 the connection area including an upstanding outer side wall; and
 the connection area being offset from the at least one active area.

2. A component in accordance with claim 1, wherein the plurality of solderable surfaces are formed exclusively on the underside of the component.

3. A component in accordance with claim 1, wherein a maximum depth of the recess amounts to at least 5 μm and at most 40 μm.

4. A component in accordance with claim 1, wherein a maximum depth of the recess amounts to at least 2% and at most 10% of a height of the component.

5. A component in accordance with claim 1, wherein the recess has a maximum depth that is equal to, or less than, a width of the recess.

6. A component in accordance with claim 1, wherein
the first insulating layer comprises at least one of silicon oxide, silicon nitride, paint or an adhesive.

7. A component in accordance with claim 1, wherein
the thickness of the first insulating layer amounts to less than 2 µm.

8. A component in accordance with claim 3, wherein the maximum depth of the recess amounts to approximately 10 to 15 µm.

9. A component in accordance with claim 4,
wherein the maximum depth of the recess amounts to between approximately 3% to 6% of the height of the component.

10. A component in accordance with claim 1,
wherein the thickness of the first insulating layer amounts to less than 1 µm.

11. A surface mountable electronic component free of connecting wires, having an upper side and an underside, the surface mountable electronic component comprising:
a semiconductor substrate having an upper side surface, an underside surface and four side surfaces, wherein each of the four side surfaces join the underside surface at an edge and are not insulated;
a plurality of solderable surfaces formed on the underside of the component; and
at least one recess formed in at least a region of the edge, the at least one recess covered with a first insulating layer,
wherein for each at least one recess, a combination of the recess and the first insulating layer forms a shape including:
a planar shoulder section, the planar shoulder section being inclined with respect to a plane defined by the underside of the surface mountable electronic component, and
a base section bounding the inclined shoulder section on one side and a side surface of the semiconductor substrate at the other side; and
at least one active region formed in a region of the semiconductor structure that is spaced apart from the side surfaces of the semiconductor substrate such that the at least one active region does not contact the at least one recess and the first insulating layer does not completely cover an exposed portion of the at least one active region;
a metallized connection section running directly between the exposed portion of the at least one active area and a downwardly extending metallized connection area;
the connection section at least partially covered by a second insulating layer which covers the connection section with the exception of a contact point between the connection section and the connection area;
the connection area including an upstanding outer side wall; and
the connection area being offset from the at least one active area.

12. The surface mountable electronic component of claim 11,
wherein a degree of inclination of the planar shoulder section with respect to the plane amounts to 30° to 80°.

13. The surface mountable electronic component of claim 11,
wherein a degree of inclination of the planar shoulder section with respect to the plane amounts to approximately 60°.

14. The surface mountable electronic component of claim 11,
wherein the base section runs in parallel to the plane defined by the underside of the surface mountable electronic component.

15. The surface mountable electronic component of claim 1, wherein the outer side wall of the connection area is positioned more outwardly toward at least one of the side surfaces of the semiconductor substrate than the at least one active area.

16. The surface mountable electronic component of claim 11, wherein the outer side wall of the connection area is positioned more outwardly toward at least one of the side surfaces of the semiconductor substrate than the at least one active area.

* * * * *